United States Patent
Veerasamy et al.

(10) Patent No.: US 8,497,155 B1
(45) Date of Patent: Jul. 30, 2013

(54) PLANARIZED TCO-BASED ANODE FOR OLED DEVICES, AND/OR METHODS OF MAKING THE SAME

(75) Inventors: Vijayen S. Veerasamy, Ann Arbor, MI (US); Jens-Peter Muller, Differdange (LU); Tukaram K. Hatwar, Penfield, NY (US)

(73) Assignees: Guardian Industries Corp., Auburn Hills, MI (US); Centre Luxembourgeois de Recherches pour le Verre et la Ceramique S.A. (C.R.V.C.), Luxembourg (LU)

( * ) Notice: Subject to any disclaimer, the term of this patent is extended or adjusted under 35 U.S.C. 154(b) by 0 days.

(21) Appl. No.: 13/488,947

(22) Filed: Jun. 5, 2012

(51) Int. Cl.
*H01L 51/52* (2006.01)
*H01L 51/56* (2006.01)

(52) U.S. Cl.
USPC .................. 438/99; 257/40; 257/E51.019

(58) Field of Classification Search
USPC ................... 257/40, E51.019; 438/99
See application file for complete search history.

(56) References Cited

U.S. PATENT DOCUMENTS

| | | | |
|---|---|---|---|
| 6,359,388 B1 | 3/2002 | Petrmichl | |
| RE38,358 E | 12/2003 | Petrmichl | |
| 6,812,648 B2 | 11/2004 | Luten et al. | |
| 6,815,690 B2 | 11/2004 | Veerasamy et al. | |
| 6,987,364 B2 | 1/2006 | Petrmichl | |
| 6,988,463 B2 | 1/2006 | Veerasamy et al. | |
| 7,030,390 B2 | 4/2006 | Veerasamy et al. | |
| 7,338,338 B2* | 3/2008 | Tsai et al. | 445/23 |
| 7,488,951 B2 | 2/2009 | Murphy et al. | |
| 7,579,203 B2* | 8/2009 | Yamazaki et al. | 438/35 |
| 7,601,436 B2 | 10/2009 | Djurovich et al. | |
| 7,629,741 B2 | 12/2009 | Liao et al. | |
| 7,659,661 B2 | 2/2010 | Park | |
| 7,662,663 B2 | 2/2010 | Cok et al. | |
| 7,663,311 B2 | 2/2010 | Im et al. | |
| 7,663,312 B2 | 2/2010 | Anandan | |
| 7,800,298 B2* | 9/2010 | Tsai et al. | 313/504 |
| 7,872,422 B2 | 1/2011 | Murphy | |
| 2012/0086023 A1 | 4/2012 | Veerasamy et al. | |
| 2012/0087127 A1 | 4/2012 | Veerasamy et al. | |

OTHER PUBLICATIONS

U.S. Appl. No. 13/488,779, filed Jun. 5, 2012, Veerasamy.
U.S. Appl. No. 12/926,713, filed Dec. 6, 2010, Alvarez.

* cited by examiner

*Primary Examiner* — Evan Pert
(74) *Attorney, Agent, or Firm* — Nixon & Vanderhye P.C.

(57) ABSTRACT

Certain example embodiments relate to organic light emitting diode (OLED)/polymer light emitting diode (PLED) devices, and/or methods of making the same. A first transparent conductive coating (TCC) layer is disposed, directly or indirectly, on a glass substrate. An outermost major surface of the TCC layer is planarized by exposing the outermost major surface thereof to an ion beam. Following said planarizing, the first TCC layer has an arithmetic mean value RMS roughness (Ra) of less than 1.5 nm. A hole transporting layer (HTL) and an electron transporting and emitting layer (ETL) are disposed, directly or indirectly, on the planarized outermost major surface of the first TCC layer. A second TCC layer is disposed, directly or indirectly, on the HTL and the ETL. One or both TCC layers may include ITO. The substrate and/or an optional optical out-coupling layer stack system may be planarized using an ion beam.

20 Claims, 8 Drawing Sheets

PLANARIZED TCO-BASED ANODE FOR OLED DEVICES, AND/OR METHODS OF MAKING THE SAME

Certain example embodiments relate to improved organic light emitting diode (OLED) and/or polymer light emitting diode (PLED) devices, and/or methods of making the same. More particularly, certain example embodiments relate to OLED and/or PLED devices that include one or more planarized layers, and/or methods of making the same. An ion beam, operating under optimized voltage and gas flow rate conditions, is used to smooth or planarize the one or more layers in the OLED/PLED devices.

BACKGROUND AND SUMMARY OF CERTAIN EXAMPLE EMBODIMENTS

An organic light emitting diode (OLED) is a light-emitting diode (LED) in which the emissive electroluminescent layer is a film of organic compounds which emit light in response to an electric current. This layer of organic semiconductor material is situated between two electrodes in some cases. Generally, for example, at least one of these electrodes is transparent. OLEDs sometimes are used in television screens; computer monitors; small or portable system screens such as those found on mobile phones and PDAs; and/or the like. OLEDs may also sometimes be used in light sources for space illumination and in large-area light-emitting elements. OLED devices are described, for example, U.S. Pat. Nos. 7,663,311; 7,663,312; 7,662,663; 7,659,661; 7,629,741; and 7,601,436, the entire contents of each of which are hereby incorporated herein by reference.

A typical OLED comprises two organic layers—namely, electron and hole transport layers—that are embedded between two electrodes. The top electrode typically is a metallic mirror with high reflectivity. The bottom electrode typically is a transparent conductive layer supported by a glass substrate. The top electrode generally is the cathode, and the bottom electrode generally is the anode. Indium tin oxide (ITO) often is used for the anode.

FIG. 1 is an example cross-sectional view of an OLED. The glass substrate 102 supports a transparent anode layer 104. The hole transmitting layer 106 may be a carbon nanotube (CNT) based layer in some cases, provided that it is doped with the proper dopants. Conventional electron transporting and emitting and cathode layers 108 and 110 also may be provided.

When a voltage is applied to the electrodes, the charges start moving in the device under the influence of the electric field. Electrons leave the cathode, and holes move from the anode in opposite direction. The recombination of these charges leads to the creation of photons with frequencies given by the energy gap (E=hv) between the LUMO and HOMO levels of the emitting molecules, meaning that the electrical power applied to the electrodes is transformed into light. Different materials and/or dopants may be used to generate different colors, with the colors being combinable to achieve yet additional colors.

There currently are several obstacles to continuous manufacturing processes for low-cost large-scale OLED production, e.g., for lighting applications. One such obstacle is the presence of local defects that cause electrical shorts. Some shorts are relatively benign in that they "burn-out" during operation resulting in only a small non-emissive, non-conducting area where the short was present. However, some do not burn out and additional shorts develop over time. These defects can be catastrophic, since current flows through the short rather than the working areas of the device. This may be true even for pixilated device architectures when all pixels are simultaneously energized, which may, for example, be the case for lighting applications. Causes of shorting defects include particle contamination during fabrication, asperities from electrode roughness, and non-uniformities in organic layer thickness.

For all of these mechanisms, the chance of encountering a defect increases as device area increases. This is particularly problematic for lighting applications where device sizes on the order of square meters are envisioned.

Some attempts have been made to incorporate an optional planarization layer between the ITO-based anode and the organic layers. However, the addition of a further planarization layer can complicate the production processes and increase expenses, e.g., as a result of the additional time and/or materials associated with the additional layer. Furthermore, the inventors of the instant application have determined that 30-40 nm defects below the organic layers can grow in size, e.g., such that they ultimately produce micron-scale defects. Thus, planarization layers may have to be comparatively thick to be effective, and the added thickness may have an impact on the operation of the anode.

Another obstacle to achieving large area devices results from the fact that OLEDs are current-driven, i.e. brightness scales with current density. Thus, larger devices require a greater current to be spread throughout the active area. There is a resistance to this spreading, given the finite conductivity of the electrodes. The finite conductivity of the electrodes can be quantified in terms of the voltage drop (Vd) as current travels along the relevant length (L) of the active area. Assuming a rectangular emitting geometry, for example, it can be shown that this voltage drop can be expressed approximately in terms of the average brightness (B), current efficiency or permittivity (E), and electrode sheet resistance (Rs) as follows:

$$B = \frac{E \times V_d \times R_s}{L^2}$$

In this equation, the brightness (B) is expressed in $Cd/m^2$, current efficiency or permittivity (E) is express in $F/m^2$, sheet resistance (Rs) is expressed in ohms/square, and L is the units of length of scale of the device. It is noted that the voltage drop across the device extent (Vd) should be less than the actual intrinsic voltage across the OLED device (Vi), so as to turn it on for the specific current flow providing the brightness. In other words, in order to maintain efficiency and brightness uniformity, Vd ideally should be significantly less than the intrinsic voltage Vi required across the thickness of a device to attain a specific brightness. The electrode sheet resistance of a typical OLED is dominated by that of the ITO transparent conductor to a value of ~10 ohms/square. The brightness required for most lighting applications is on the order of 1000 $cd/m^2$. The most efficient OLEDs demonstrated to date at this brightness are green devices and these require an intrinsic voltage of ~4V and have a current efficiency of ~70 cd/A. Substituting these values into the above equation, one can see that, even for the most efficient OLEDs, the current spreading length should be less than ~5 cm to keep Vd less than 10% of Vi. Again, this is a significant issue when device sizes on the order of square meters are envisioned.

Thus, it will be appreciated that there is a need in the art for improved techniques for making OLED devices that over these and/or other difficulties.

One aspect of certain example embodiments relates to planarizing one or more of a supporting substrate, an optical out-coupling layer stack system, and an anode layer, e.g., using one or more ion beams. Doing so may advantageously reduce the overall surface roughness of, and/or the presence of potentially short-forming peaks on, the subassembly on which subsequent organic layers are to be formed.

Certain example embodiments relate to a method of making an organic light emitting diode (OLED) device. A first layer comprising a first transparent conductive coating (TCC) is disposed, directly or indirectly, on a glass substrate. An outermost major surface of the first layer comprising the first TCC is planarized by exposing the outermost major surface of the first layer comprising the first TCC to an ion beam. Following said planarizing, the first layer has an arithmetic mean value RMS roughness (Ra) of less than 1.5 nm. A hole transporting layer (HTL) and an electron transporting and emitting layer (ETL) are disposed, directly or indirectly, on the planarized outermost major surface of the first layer comprising the first TCC. A second layer comprising a second TCC is disposed, directly or indirectly, on the HTL and the ETL.

Certain example embodiments relate to a method of making an OLED device is provided. An optical out-coupling layer stack (OCLS) system is disposed, directly or indirectly, on a glass substrate. A first layer comprising a first transparent conductive coating (TCC) is disposed, directly or indirectly, on a glass substrate. An outermost major surface of the first layer comprising the first TCC is ion beam treated in connection with an ion beam operating in an argon-inclusive environment at at least partial vacuum and at a voltage of 1275-1725 volts and an argon flow rate of 289-391 sccm. A hole transporting layer (HTL) and an electron transporting and emitting layer (ETL) are disposed, in this order, directly or indirectly, on the ion beam treated outermost major surface of the first layer comprising the first TCC. A second layer comprising a second TCC is disposed, directly or indirectly, on the HTL and the ETL.

Certain example embodiments relate to an OLED device. A substrate has an ion beam planarized major surface. An optical OCLS system is supported by the planarized major surface of the substrate, with the OCLS system having an ion beam treated major surface. An anode layer comprising indium tin oxide (ITO) is supported by the ion beam treated major surface of the OCLS system, with the anode layer having an ion beam treated major surface. First and second organic layers are supported by the ion beam treated major surface of the anode layer. A partially reflective cathode layer is supported by the first and second organic layers. The anode layer, following ion beam treatment, has an arithmetic mean value RMS roughness (Ra) of less than 1.2 nm, and is substantially free from peaks of greater than 40 nm in height.

According to certain example embodiments, the OLED device may be built into a lighting system or other electronic device such as, for example, a display or display device.

These and other embodiments, features, aspect, and advantages may be combined in any suitable combination or subcombination to produce yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF CERTAIN EXAMPLE EMBODIMENTS

Certain example embodiments incorporate one or more ion beam treatments into the OLED device fabrication techniques. More particularly, in certain example embodiments, the supporting substrate, an optional optical out-coupling layer stack, and/or the OLED's transparent conductive coating (TCC) based anode, may be subjected to an ion beam smoothening procedure. In this way, it becomes possible to substantially remove asperities without significantly changing the conductivity of the TCC. It also is possible in certain example embodiments to use this ion beam planarization technique to effectively tune the work function of the ITO, increasing it to a value that makes it a better anode than un-treated ITO.

These and/or other improvements become possible through the development of optimized recipes, which specify the gas species, gas flow rates, and ion energy window, as well as angle of incidence. Certain example embodiments advantageously result in light emission improvements, as well as substantial lifetime improvements, e.g., on the order of ten times, compared to untreated anodes. Such improvements, e.g., as enabled through he various surface treatment techniques described herein may make OLEDs viable for large-scale lighting and/or other applications.

An ion source is a device that ionizes gas molecules. The ionized molecules are then accelerated and emitted in a beam towards a substrate. The ionized beam may be used for cleaning, activation, polishing, etching, and/or deposition of thin-film coatings/layer(s). Example ion sources are disclosed, for example, in U.S. Pat. Nos. 7,872,422; 7,488,951; 7,030,390; 6,988,463; 6,987,364; 6,815,690; 6,812,648; 6,359,388; and Re. 38,358; the disclosures of each of which are hereby incorporated herein by reference.

Figure 1:
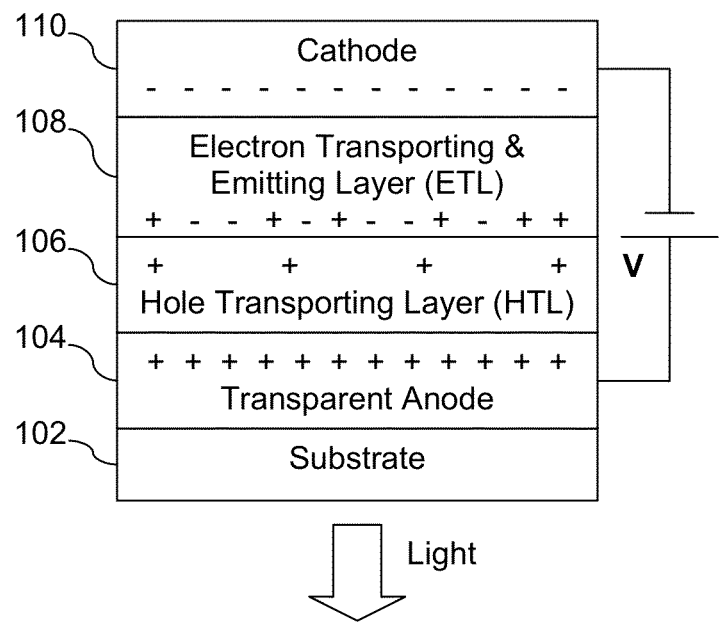
FIG. 1 is an example cross-sectional view of an OLED.
Figure 2:
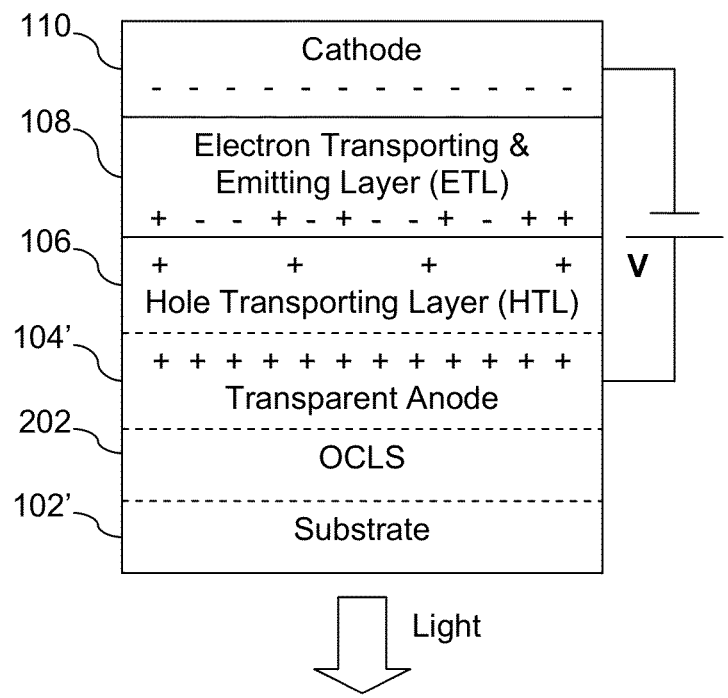
FIG. 2 is an example cross-sectional view of an OLED device in accordance with certain example embodiments.

FIG. 2 is an example cross-sectional view of an OLED device in accordance with certain example embodiments. FIG. 2 is similar to FIG. 1, except that it includes an optional optical out-coupling layer stack (OCLS) 202, and shows the substrate 102', the OCLS 202, and the transparent anode 104' having ion-beam treated surfaces. It will be appreciated that any one or more of these layers may have an ion-beam treated surface in different embodiments. In other words, although FIG. 2 shows all of the aforementioned layers being ion beam treated, other example embodiments may ion beam treat only one or two of such layers. It will be appreciated that the FIG. 2 example embodiment lacks a separate planarization layer, e.g., between the ITO-based anode 104' and the organic layers 106 and 108 disposed thereon—although other example embodiments may include such a layer.

As indicated above, the inventors of the instant application have determined that 30-40 nm defects below the organic layers can grow in size, e.g., such that they ultimately produce micron-scale defects. In addition, it has been observed that the RMS roughness (Ra, arithmetic mean value) for a substrate supporting an OCLS and an ITO-based anode typically is about 2-2.5 nm, and sometimes as high as about 3 nm. However, the example ion beam disclosures identified above may be used for planarization purposes on one or more the above-identified layers. For instance, it is possible in some cases to reduce the likelihood (and sometimes even completely eliminate) the appearance of micron-size defects, and/or achieve an RMS roughness (Ra, arithmetic mean value) of less than 2 nm, more preferably less than 1.5 nm, still more preferable less than 1.2 nm, and sometimes even less than about 1.1 nm or 1.0 nm.

Figure 3:
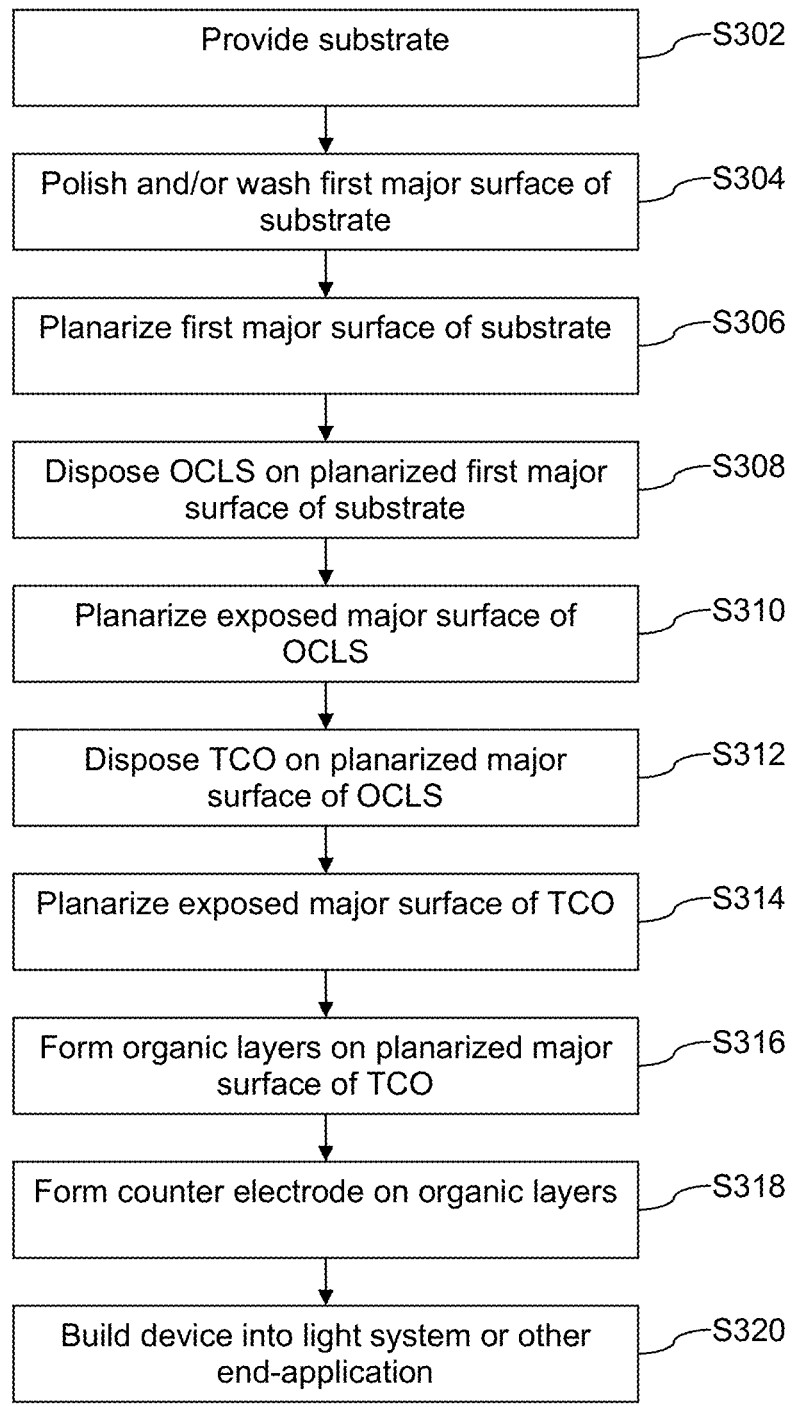
FIG. 3 is a flowchart showing an example process for making an OLED-based lighting system in accordance with certain example embodiments.

FIG. 3 is a flowchart showing an example process for making an OLED-based lighting system in accordance with certain example embodiments. A substrate is provided in step S302. The substrate may be a glass substrate in certain example implementations, e.g., from 1.0-6.0 mm thick. In some electronics applications, however, the substrate may be thinner, e.g., 1.3-3.0 mm thick. In other example embodiments, alternate materials may be provided. In any event, the substrate may be polished and/or washed (e.g., with deionized water) in step S304, e.g., to help clean it and/or prepare it for subsequent layer deposition processes. Optionally, in step S306, a first major surface on which subsequent layers are to be disposed may be planarized, e.g., using an ion beam, e.g., operating in an argon-inclusive vacuum environment. The optical out-coupling layer stack (OCLS) system may be disposed on this planarized surface in step S308. Example OCLS materials are set forth, for example, in U.S. application Ser. No. 13/488,779 filed on Jun. 5, 2012, the entire contents of which are hereby incorporated herein by reference. In step S308, the exposed major surface of the optional OCLS system also may be planarized, e.g., using an or the ion beam in the same or similar environment operating under the same or similar conditions.

A transparent conductive coating (such as, for example, a transparent conductive oxide or TCO) is disposed on the planarized major surface of the OCLS system in step S312. This TCO may comprise ITO or any other suitable transparent conductive coating that is compatible with the organic layers to be disposed thereon. This underlying TCO layer typically will be used as the anode, although it may be used as a cathode in certain example configurations. In step S314, the exposed major surface of the TCO may be planarized, e.g., using an or the ion beam in the same or similar environment operating under the same or similar conditions.

This subassembly (including the substrate, the optional OCLS system, and the TCO) should be very flat and smooth and, in certain example embodiments, may lack peaks or valleys greater than 30-40 nm. In certain example embodiments, the RMS roughness (Ra, arithmetic mean value) is less than 2 nm, more preferably less than 1.5 nm, still more preferable less than 1.2 nm, and sometimes even less than about 1.1 nm or 1.0 nm.

The organic layers may be disposed on this very flat, very smooth surface in step S316. The organic layers include the HTL and the ETL. In step S318, the counter-electrode (which typically will be the cathode) is formed on the organic layers. This cathodic layer may be reflective in certain example instances. This OLED device subassembly ultimately may be built into a lighting system or other end-application (such as, for example, a display or display device, etc.).

In certain example embodiments, in one or more steps not shown, CRI matching layers, antireflective (AR) coatings, and/or the like may be provided.

In certain example embodiments, the ion beam voltages may be comparatively low and the flow rates may be comparatively high. For instance, certain example embodiments may use an ion beam voltage of 1000-2000 volts, more preferably of 1125-1875 volts, and still more preferably 1275-1725 volts, with an example voltage of 1500 volts. Gas flow may range of preferably 255-425 sccm, more preferably of 289-391 sccm, and still more preferably of more preferably 330-350 sccm, with an example flow rate of 340 sccm. In certain example embodiments, the ion beam planarization may take place in a noble gas inclusive environment. For instance, in certain example embodiments, the ion beam planarization may take place in an argon-filled vacuum environment.

Several samples were generated and tested. More particularly, ITO was deposited on 1.6 mm soda lime silica glass. The ITO was deposited to a thickness of 150 nm. The following table summarizes the linear ion beam voltage and argon gas flow for each of the samples.

| Sample # | Ion Beam Voltage (Volts) | Argon Gas Flow (sccm) |
| --- | --- | --- |
| 1 | 2250 | 325 |
| 2 | 3000 | 340 |
| 3 | 3000 | 250 |
| 4 | 1500 | 250 |
| 5 | 1500 | 340 |

Atomic force microscopy (AFM) testing was performed on these samples, as well as for an untreated control sample. The following table reports line and area RMS roughness in terms of the root mean-square-average value (Rq, in nm)

| | RMS Roughness (Rq) (nm) | |
| --- | --- | --- |
| Sample # | Line | Area |
| 1 | 2.82 | 2.293 |
| 2 | 4.20 | 3.237 |
| 3 | 2.61 | 2.35 |
| 4 | 1.85 | 1.505 |
| 5 | 1.69 | 1.112 |
| Untreated | 6.49 | 4.322 |

Figure 4:
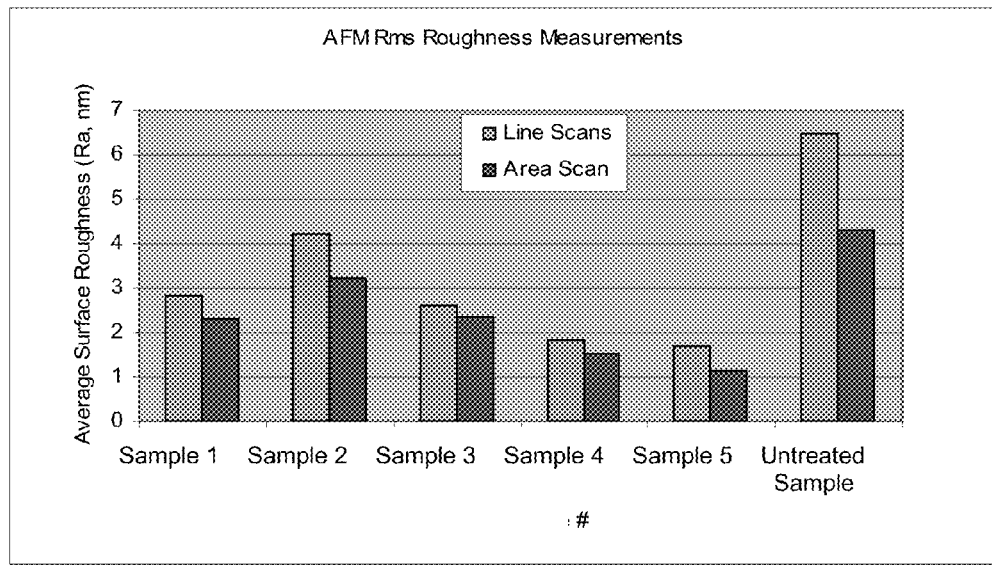
FIG. 4 is a graph that shows line and area scans of average surface roughness (Ra) for ion beam treated samples, as well as an untreated sample, as measured using AFM techniques.

FIG. 4 is a graph that shows line and area scans of average surface roughness (Ra) for these samples, as well as the untreated sample, as measured using AFM techniques. Sample 5 in FIG. 4 has an RMS roughness (Ra) of 1.1 nm. Sample 5 in particular shows a significant reduction in RMS roughness using ion beam etching with Ar gas.

Thus, the table above and the FIG. 4 graph confirm that the best RMS roughness values can be achieved using lower voltages and higher gas flow rates. There seems to be a synergistic effect as between lower voltages and high gas flow rates in terms of the overall effect on RMS roughness. Indeed, while low ion beam voltage and low Ar gas flow rate is desirable as compared to the untreated sample, increasing the gas flow rate still further significantly reduces Ra over area scans. Thus, the inventors have determined that voltage and gas flow are the critical parameters, and that comparatively low values for both result in the smoothest and cleanest surfaces. Of course, it will be appreciated that this technique in general is a "clean process," because the ion beam planarization treatment is performed in a vacuum and residue tends to be removed with the vacuum.

Figure 5A:
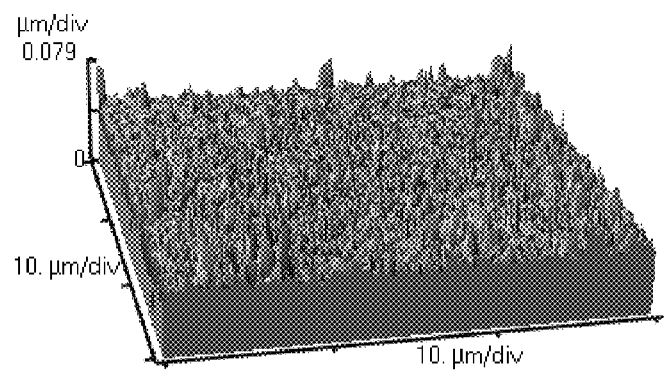
FIGS. 5*a* and 5*b* are AFM images of a sample before and after ion beam treatment in accordance with the example techniques disclosed herein, respectively.
Figure 5B:
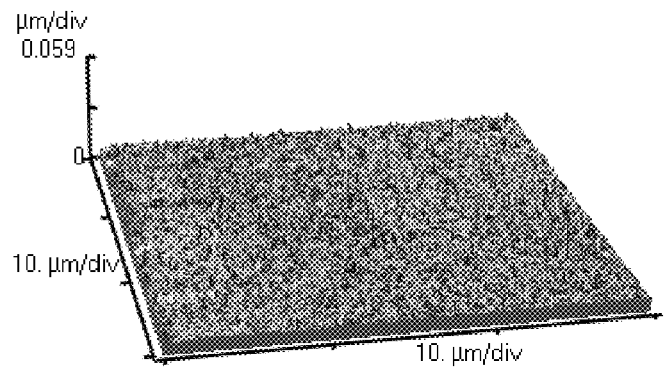
Figure 6A:
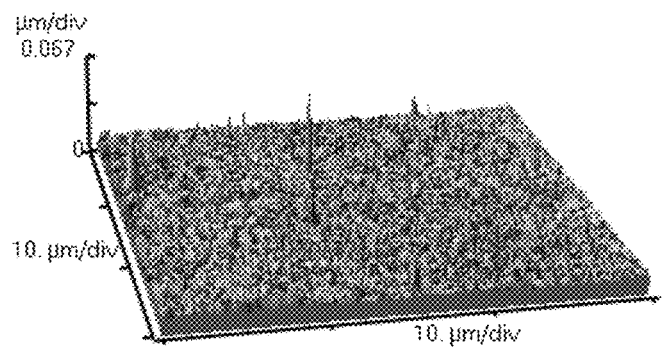
FIGS. 6*a*-6*e* are AFM images of ITO on glass samples after ion beam treatment in accordance with the example techniques disclosed herein.
Figure 6B:
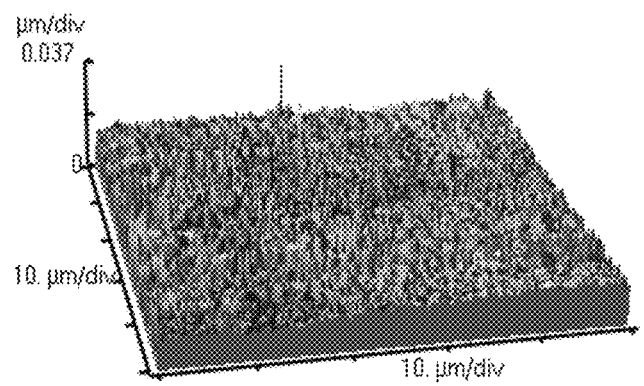
Figure 6C:
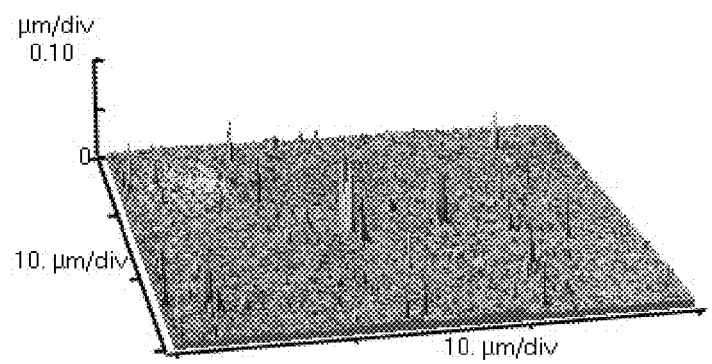
Figure 6D:
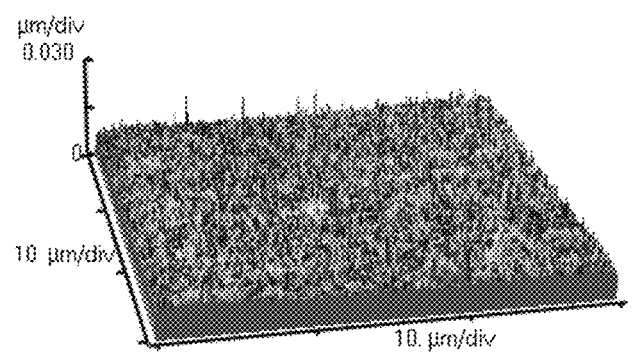
Figure 6E:
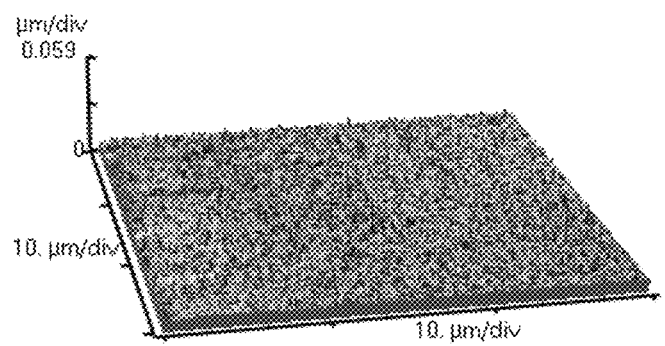

FIGS. 5a and 5b are AFM images of sample 5 before and after ion beam treatment, respectively. It can be seen that the ion beam planarization techniques described herein smoothen the entire surface and significantly reduce the number of spikes. Even the few spikes that remain generally are less than about 30 nm. This ultimately will reduce the number of micron size defects that are generated.

FIGS. 6a-6e are AFM images of samples 1-5, respectively, after ion beam treatment. As can be seen, overall roughness is reduced as compared to the untreated image shown in FIG. 5a. In addition, the peaks are reduced to thicknesses that preferably will not lead to micron-sized defects when the remaining OLED layers are disposed on the anode. That is, any peaks preferably are below about 30-40 nm in height, more preferably less than 20-30 nm in height.

Figure 7A:
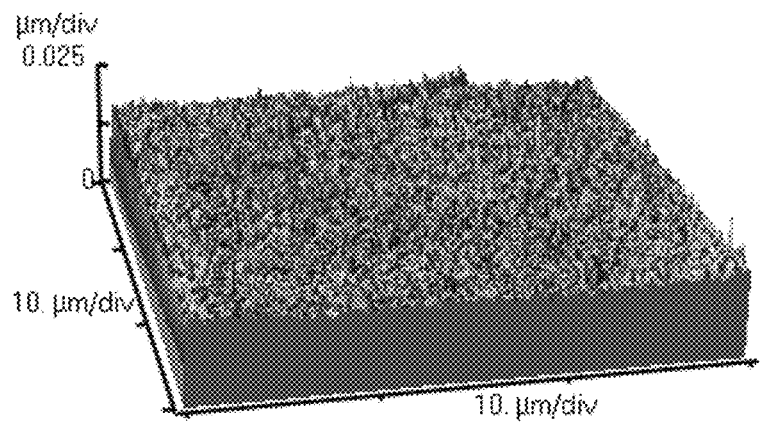
FIGS. 7*a*-7*b* show the surface of a glass substrate before and after ion beam treatment in accordance with certain example embodiments.
Figure 7B:
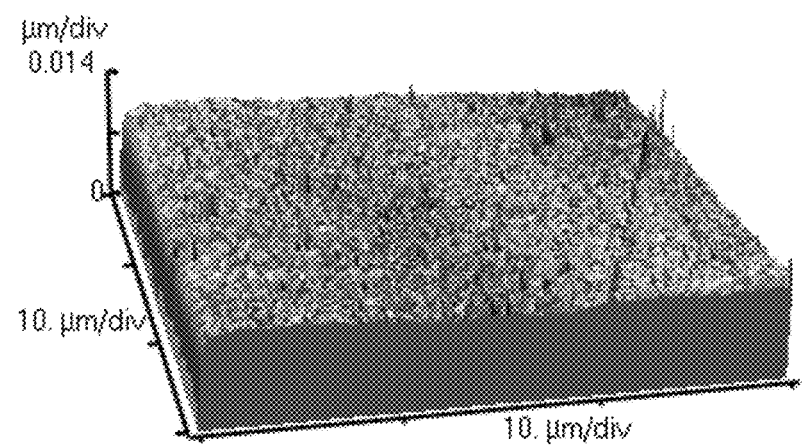

As indicated above, the ion beam planarization techniques described herein may be used on the underlying substrate. In this regard, FIGS. 7a and 7b show the surface of a glass substrate before and after ion beam treatment in accordance with certain example embodiments. The substrate tested was a 3 mm "clear" glass substrate, available from the assignee of the instant invention. The starting RMS roughness (Rq) was 2.2 nm, with an average roughness (Ra) of 1.4 nm. After ion beam treatment, the surface was noticeably smoother, with an RMS roughness (Rq) of 1.4 nm, and an average roughness (Ra) of 0.9 nm.

It will be appreciated that the same process conditions as those described above may be used for roughening the glass substrate, and/or the OCLS in different embodiments.

Figure 8:
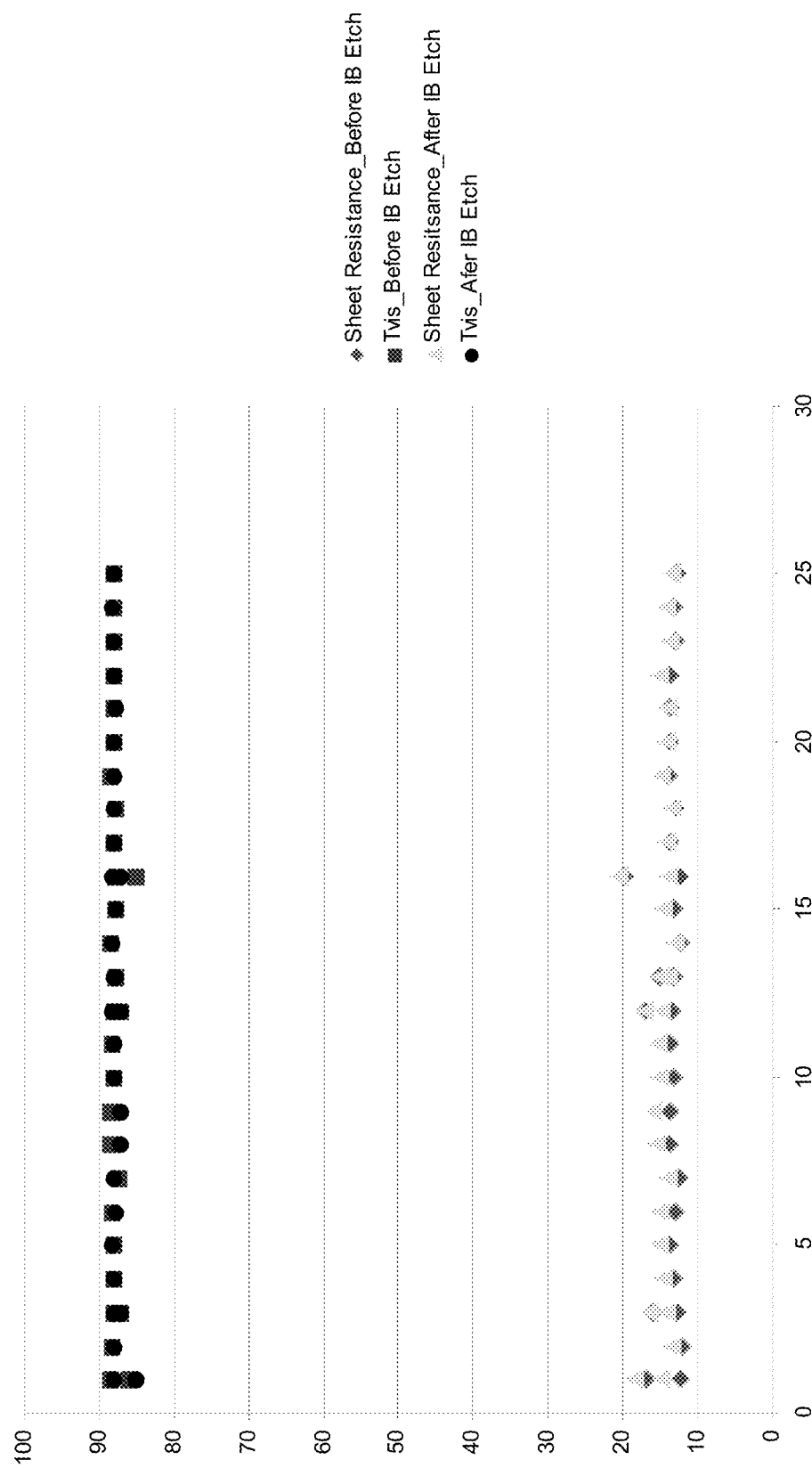
FIG. 8 is a graph showing sheet resistance and visible transmission for a number of different ITO on glass samples after ion beam treatment in accordance with the example techniques disclosed herein.

FIG. 8 is a graph showing sheet resistance and visible transmission for a number of different ITO on glass samples after ion beam treatment in accordance with the example techniques disclosed herein. As can be seen from FIG. 8, the ion beam treatment does not have a significant negative effect on visible transmission or sheet resistance. That is, in certain example embodiments, visible transmission is decreased and sheet resistance is increased by no more 15%, more preferably by no more than 10%, and still preferably by no more than 5%, as a result of the ion beam treatment of the ITO. However, as indicated above, it is possible in certain example instances to use the ion beam to tune the work function of the ITO, increasing it to a value that makes it a better anode than un-treated ITO. In certain example embodiments, it may be possible to use the ion beam to tune the work function of the ITO by carbon ion implantation, by implanting or removing oxygen with argon bombardment, etc.

It has been found that dynamic etch rate can be expressed as a function of angle and speed. It has been determined, for example, that the dynamic etch rate can be optimized so that it peaks at an angle of incidence of 25-75 degrees, more preferably of 35-65 degrees, and most preferable of 45-55 degrees. The following description helps explain how the dynamic etch rate can be modified.

The following table involves acrylic etched with argon and oxygen, and with the ion beam operating in collimated mode. More particularly, samples were etched in a mixture of 30 sccm Ar and 30 sccm oxygen for a total of 100 passes. Current was held constant at 3000 V and current ran at ~0.17 Amps. Line speed was 140 inches per minute. The samples were not washed prior to exposure to the ion beam.

| Beam Angle | Etch Depth (angstroms) | | | | Avg. depth | Avg. depth per pass (Å) |
|---|---|---|---|---|---|---|
| | reading 1 | reading 2 | reading 3 | reading 4 | | |
| 3 | 7,563 | 8,532 | 8,370 | | 8,155 | 81.6 |
| 7 | 9,403 | 10,200 | | | 9,802 | 98.0 |
| 43 | 8,039 | 7,599 | 9,656 | 8,134 | 8,357 | 83.6 |
| 58 | 8,233 | 7,201 | 8,668 | 8,502 | 8,151 | 81.5 |
| 63 | 7,806 | 7,380 | | | 7,593 | 75.9 |

The following table involves acrylic and soda lime silica glass etched with 50 sccm Argon and 80 sccm oxygen for a total of 35 passes, and with the ion beam operating in diffuse mode. Current was held at 3000 V and current ran at ~0.17 Amps. Line speed was 140 inches per minute. As can be seen from the table below, the average etch depth and average etch depth per pass for the acrylic sample was 255 angstroms and 7.3 angstroms, respectively. The average etch depth and average etch depth per pass for the soda lime silica glass sample was 6765 angstroms and 193.3 angstroms, respectively.

| Sample Type | Beam Angle | Etch Depth (angstroms) | | | | | | | | | |
|---|---|---|---|---|---|---|---|---|---|---|---|
| | | 1 | 2 | 3 | 4 | 5 | 6 | 7 | 8 | 9 | 10 |
| Acrylic | ~40 | 243 | 258 | 301 | 266 | 291 | 208 | 220 | 250 | 242 | 266 |
| Glass | ~40 | 6575 | 6458 | 6889 | 7002 | 6901 | | | | | |

The following table involves acrylic etched with 100 sccm oxygen for a total of 30 passes, and with the ion beam operating in collimated mode. Current was held at 3000 V and current ran at ~0.17 Amps. Line speed was 140 inches per minute.

| Beam Angle | Etch Depth (angstroms) | | | | | Avg. | Avg. depth per pass (Å) |
|---|---|---|---|---|---|---|---|
| | 1 | 2 | 3 | 4 | 5 | | |
| ~40 | 1,237 | 1,111 | 1,117 | 972 | 1,031 | 1,094 | 36.5 |

The following table shows the results of glass and silicon being etched with different angles, but similar otherwise conditions:

| | Angstroms Etched Per Scan | |
|---|---|---|
| Degrees Angled | Glass Sample | Silicon Sample |
| 0 | 6.9 | 5.6 |
| 15 | 6.9 | 5.2 |
| 25 | 10.2 | 8.7 |
| 40 | 10.8 | 13.3 |
| 50 | 13.6 | 13.2 |

The following table involves acrylic etched in 60 sccm Ar for a total of 100 passes. Current was held constant at 3000 V and current ran at ~0.17 Amps. Line speed was 140 inches per minute. The samples were not washed prior to exposure to the ion beam.

| Beam | Etch Depth (angstroms) | | | | | | Avg. depth |
| --- | --- | --- | --- | --- | --- | --- | --- |
| Angle | 1 | 2 | 3 | 4 | 5 | Avg. | per pass (Å) |
| 3 | 2,183 | 2,769 | 2,251 | 1,862 | 2,726 | 2,358 | 23.6 |
| 7 | 2,294 | 2,166 | 2,032 | 2,097 | 2,093 | 2,136 | 21.4 |
| 43 | 1,816 | 1,965 | 2,013 | 2,871 | 2,403 | 2,214 | 22.1 |
| 63 | 2,372 | 3,140 | 2,886 | 3,246 | 2,316 | 2,792 | 27.9 |

Figure 9:
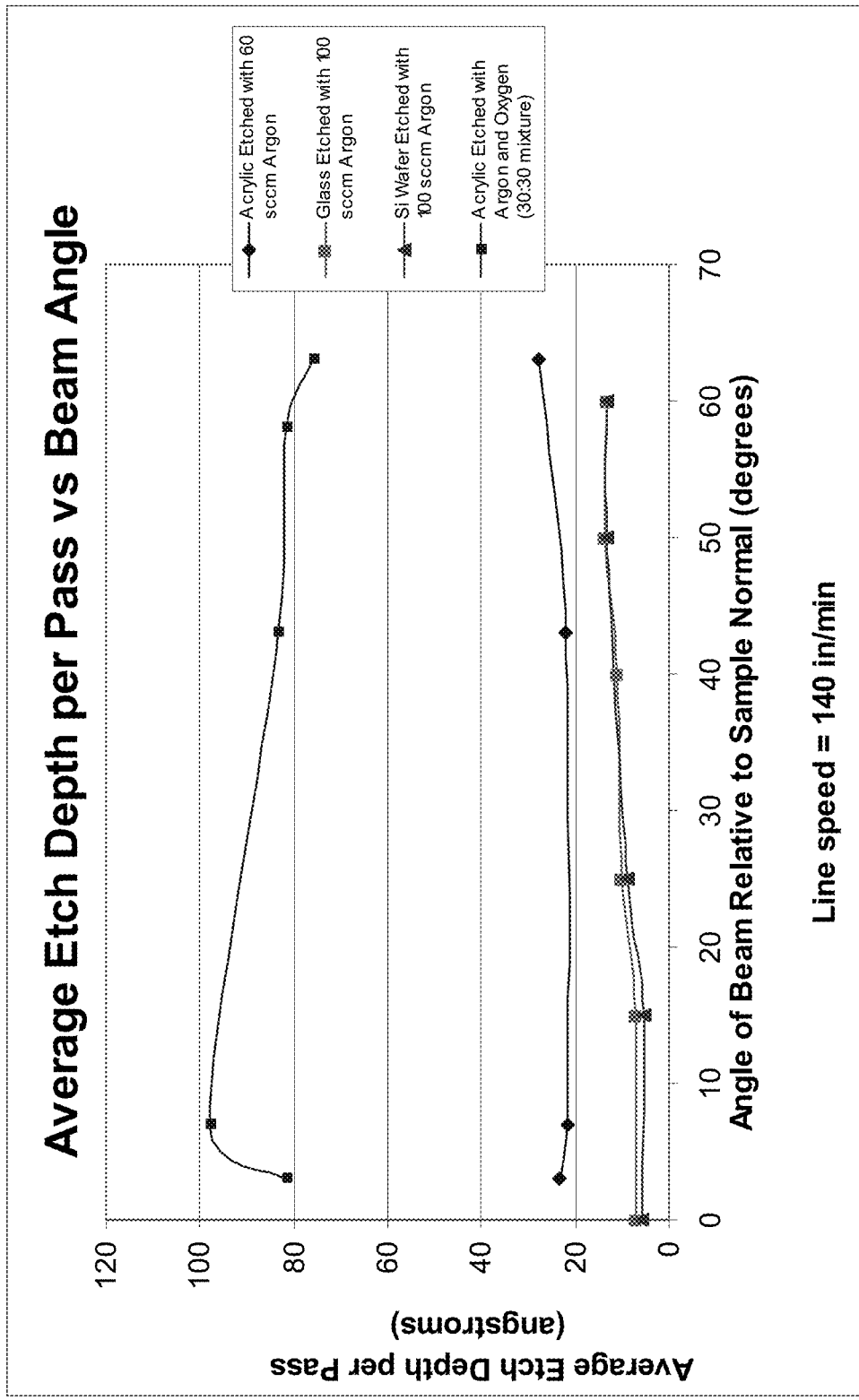
FIG. 9 plots average etch depth per pass (in angstroms) versus beam angle (in degrees, relative to the sample being normal), for acrylic, glass, and silicon wafer samples under different conditions.

FIG. 9 is a graph summarizing the experiments discussed above. That is, FIG. 9 plots average etch depth per pass (in angstroms) versus beam angle (in degrees, relative to the sample being normal), for acrylic, glass, and silicon wafer samples under different conditions. It will be appreciated that similar data may be gathered to help determine the optimal or at least improved incidence angle, line speed, power levels, flow rates, etchants, ion beam operating modes, etc., e.g., to help improve and/or optimize dynamic etch rate.

Although certain example embodiments have been described in connection with ITO being used as the TCO, it will be appreciated that other conductive oxide materials may be used in place of ITO. Alternate materials may include, for example, zinc oxide, aluminum-doped zinc oxide (AZO), indium gallium zinc oxide (IGZO), etc. In addition, although certain example embodiments have been described in connection with an anode, it will be appreciated that the device layers may be "reversed," and the example techniques disclosed herein may be used in connection with a cathode.

These techniques similarly may be used in inorganic light emitting diode (ILED), polymer light emitting diode (PLED), and/or other applications. See, for example, U.S. Publication No. 2012/0086023, and U.S. application Ser. No. 12/926,713, filed Dec. 6, 2010, which describe examples of such devices, and are hereby incorporated herein by reference. As is known, PLEDs or POLEDs may be dispensed wet, whereas smOLEDs may be evaporatable.

The OLED, PLED, and/or ILED devices disclosed herein may have additional features, e.g., to enable such devices to be incorporated into Lambertian or non-Lambertian light sources. CRI-matching techniques also may be used in connection with certain example embodiments. In these regards, see, for example, U.S. Publication No. 2012/0087127, the entire contents of which are hereby incorporated herein by reference.

Although certain example embodiments have been described as involving TCOs of or including ITO, other example embodiments may use these and/or other materials in a TCC. For instance, silver-inclusive TCCs may be used in anodes in certain example embodiments. The planarization parameters may be adjusted, where appropriate, to accommodate these alternative materials in different embodiments.

In certain example embodiments, a method of making an organic light emitting diode (OLED) device is provided. A first layer comprising a first transparent conductive coating (TCC) is disposed, directly or indirectly, on a glass substrate. An outermost major surface of the first layer comprising the first TCC is planarized by exposing the outermost major surface of the first layer comprising the first TCC to an ion beam wherein, following said planarizing, the first layer has an arithmetic mean value RMS roughness (Ra) of less than 1.5 nm. A hole transporting layer (HTL) and an electron transporting and emitting layer (ETL) are disposed, directly or indirectly, on the planarized outermost major surface of the first layer comprising the first TCC. A second layer comprising a second TCC is disposed, directly or indirectly, on the HTL and the ETL.

In addition to the features of the previous paragraph, in certain example embodiments, the first TCC may comprise indium tin oxide.

In addition to the features of either of the previous two paragraphs, in certain example embodiments, the first layer may an anode and the second layer may be a cathode.

In addition to the features of any of the three previous paragraphs, in certain example embodiments, the device may be free from any planarization layers between the first layer and the HTL.

In addition to the features of any of the four previous paragraphs, in certain example embodiments, a major surface of the glass substrate may be planarized, via an or the ion beam, prior to the disposing of the first layer thereon.

In addition to the features of any of the five previous paragraphs, in certain example embodiments, an optical out-coupling layer stack (OCLS) system may be disposed on the glass substrate, with the first layer being disposed on the OCLS system.

In addition to the features of the previous paragraph, in certain example embodiments, an exposed major surface of the glass substrate and/or the OCLS system may be planarizing, via an or the ion beam.

In addition to the features of any of the seven previous paragraphs, in certain example embodiments, the planarizing may be performed in an argon-inclusive environment at at least partial vacuum.

In addition to the features of the previous paragraph, in certain example embodiments, the ion beam may operate at a voltage of 1275-1725 volts and an argon flow rate of 289-391 sccm (and for example 330-350 sccm).

In addition to the features of the previous paragraph, in certain example embodiments, following said planarizing, the first layer may have an arithmetic mean value RMS roughness (Ra) of less than 1.2 nm.

In addition to the features of either of the previous two paragraphs, in certain example embodiments, following said planarizing, the first layer may lack all or nearly all peaks over 40 nm in height.

In certain example embodiments, a method of making an organic light emitting diode (OLED) device is provided. An optical out-coupling layer stack (OCLS) system is disposed, directly or indirectly, on a glass substrate. A first layer comprising a first transparent conductive coating (TCC) is disposed, directly or indirectly, on a glass substrate. An outermost major surface of the first layer comprising the first TCC is ion beam treated in connection with an ion beam operating in an argon-inclusive environment at at least partial vacuum and at a voltage of 1275-1725 volts and an argon flow rate of 289-391 sccm. A hole transporting layer (HTL) and an electron transporting and emitting layer (ETL) are disposed, in this order, directly or indirectly, on the ion beam treated outermost major surface of the first layer comprising the first TCC. A second layer comprising a second TCC is disposed, directly or indirectly, on the HTL and the ETL.

In addition to the features of the previous paragraph, in certain example embodiments, the first layer may be an anode and the second layer may be a cathode.

In addition to the features of either of the previous two paragraphs, in certain example embodiments, the second layer may be reflective.

In addition to the features of any of the three previous paragraphs, in certain example embodiments, following said ion beam treating, the first layer may have an arithmetic mean value RMS roughness (Ra) of less than 1.2 nm.

In addition to the features of any of the four previous paragraphs, in certain example embodiments, major surfaces of the glass substrate and the OCLS system may be planarized via an ion beam treatment.

In addition to the features of any of the five previous paragraphs, in certain example embodiments, following said ion beam treating, the first layer may lack all or nearly all peaks over 40 nm in height.

In certain example embodiments, an organic light emitting diode (OLED) device is provided. A substrate has an ion beam planarized major surface. An optical out-coupling layer stack (OCLS) system is supported by the planarized major surface of the substrate, with the OCLS system having an ion beam treated major surface. An anode layer comprising indium tin oxide (ITO) is supported by the ion beam treated major surface of the OCLS system, with the anode layer having an ion beam treated major surface. First and second organic layers are supported by the ion beam treated major surface of the anode layer. A partially reflective cathode layer is supported by the first and second organic layers. The anode layer, following ion beam treatment, has an arithmetic mean value RMS roughness (Ra) of less than 1.2 nm, and is substantially free from peaks of greater than 40 nm in height.

In certain example embodiments, a lighting system may comprise the OLED device of the previous paragraph and/or may be made according to the example methods of any of the 18 previous paragraphs.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers there between.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making an organic light emitting diode (OLED) device, the method comprising:
    disposing a first layer comprising a first transparent conductive coating (TCC), directly or indirectly, on a glass substrate;
    planarizing an outermost major surface of the first layer comprising the first TCC by exposing the outermost major surface of the first layer comprising the first TCC to an ion beam wherein, following said planarizing, the first layer has an arithmetic mean value RMS roughness (Ra) of less than 1.5 nm;
    disposing a hole transporting layer (HTL) and an electron transporting and emitting layer (ETL), directly or indirectly, on the planarized outermost major surface of the first layer comprising the first TCC;
    disposing a second layer comprising a second TCC, directly or indirectly, on the HTL and the ETL.

2. The method of claim 1, wherein the first TCC comprises indium tin oxide.

3. The method of claim 1, wherein the first layer is an anode and the second layer is a cathode.

4. The method of claim 1, wherein the device is free from any planarization layers between the first layer and the HTL.

5. The method of claim 1, further comprising planarizing, via an or the ion beam, a major surface of the glass substrate prior to the disposing of the first layer thereon.

6. The method of claim 1, further comprising disposing an optical out-coupling layer stack (OCLS) system on the glass substrate, the first layer being disposed on the OCLS system.

7. The method of claim 6, further comprising planarizing an exposed major surface of the glass substrate and/or the OCLS system, via an or the ion beam.

8. The method of claim 1, wherein the planarizing is performed in an argon-inclusive environment at at least partial vacuum.

9. The method of claim 8, wherein the ion beam operates at a voltage of 1275-1725 volts and an argon flow rate of 289-391 sccm.

10. The method of claim 9, wherein the argon flow rate is 330-350 sccm.

11. The method of claim 10, wherein, following said planarizing, the first layer has an arithmetic mean value RMS roughness (Ra) of less than 1.2 nm.

12. The method of claim 10, wherein, following said planarizing, the first layer lacks all or nearly all peaks over 40 nm in height.

13. A method of making an organic light emitting diode (OLED) device, the method comprising:
    disposing an optical out-coupling layer stack (OCLS) system, directly or indirectly, on a glass substrate;
    disposing a first layer comprising a first transparent conductive coating (TCC), directly or indirectly, on a glass substrate;
    ion beam treating an outermost major surface of the first layer comprising the first TCC in connection with an ion beam operating in an argon-inclusive environment at at least partial vacuum and at a voltage of 1275-1725 volts and an argon flow rate of 289-391 sccm;
    disposing a hole transporting layer (HTL) and an electron transporting and emitting layer (ETL), in this order, directly or indirectly, on the ion beam treated outermost major surface of the first layer comprising the first TCC;
    disposing a second layer comprising a second TCC, directly or indirectly, on the HTL and the ETL.

14. The method of claim 13, wherein the first layer is an anode and the second layer is a cathode.

15. The method of claim 13, wherein the second layer is reflective.

16. The method of claim 13, wherein, following said ion beam treating, the first layer has an arithmetic mean value RMS roughness (Ra) of less than 1.2 nm.

17. The method of claim 13, further comprising planarizing major surfaces of the glass substrate and the OCLS system via an ion beam treatment.

18. The method of claim 13, wherein, following said ion beam treating, the first layer lacks all or nearly all peaks over 40 nm in height.

19. An organic light emitting diode (OLED) device, comprising:
    a substrate having an ion beam planarized major surface;
    an optical out-coupling layer stack (OCLS) system supported by the planarized major surface of the substrate, the OCLS system having an ion beam treated major surface;
    an anode layer comprising indium tin oxide (ITO), supported by the ion beam treated major surface of the OCLS system, the anode layer having an ion beam treated major surface;
    first and second organic layers supported by the ion beam treated major surface of the anode layer; and
    a partially reflective cathode layer supported by the first and second organic layers, wherein the anode layer, following ion beam treatment, has an arithmetic mean value RMS roughness (Ra) of less than 1.2 nm, and is substantially free from peaks of greater than 40 nm in height.

20. A lighting system comprising the OLED device of claim 19.

* * * * *